United States Patent [19]
Toda

[11] Patent Number: 5,068,713
[45] Date of Patent: Nov. 26, 1991

[54] SOLID STATE IMAGE SENSING DEVICE

[75] Inventor: Shigeo Toda, Nagano, Japan

[73] Assignee: Seiko Epson Corporation, Tokyo, Japan

[21] Appl. No.: 393,729

[22] Filed: Aug. 15, 1989

[30] Foreign Application Priority Data

| Aug. 18, 1988 | [JP] | Japan | 63-205542 |
| Aug. 29, 1988 | [JP] | Japan | 63-214443 |
| Aug. 29, 1988 | [JP] | Japan | 63-214452 |

[51] Int. Cl.$^5$ .......................................... H01L 23/28
[52] U.S. Cl. .................................. 357/72; 357/73; 357/80; 357/32; 357/30
[58] Field of Search .............. 357/17, 32, 30 D, 30 H, 357/30 R, 30 L, 72, 73, 74, 80

[56] References Cited

U.S. PATENT DOCUMENTS

| 4,654,536 | 3/1987 | Saito et al. | 357/65 |
| 4,675,535 | 6/1987 | Tsunekawa et al. | 357/30 H |
| 4,710,797 | 12/1987 | Tanaka | 357/74 |
| 4,877,306 | 10/1989 | Kar | 350/96.33 |

FOREIGN PATENT DOCUMENTS

| 57-190455 | 11/1982 | Japan . | |
| 59-86363 | 6/1984 | Japan | 357/30 L |
| 60-62278 | 4/1985 | Japan . | |
| 61-126861 | 5/1986 | Japan | 357/30 L |
| 61-234161 | 10/1986 | Japan . | |
| 62-104044 | 5/1987 | Japan . | |
| 62-241358 | 10/1987 | Japan | 357/72 |

Primary Examiner—Rolf Hille
Assistant Examiner—Minhloan Tran
Attorney, Agent, or Firm—Blum Kaplan

[57] ABSTRACT

A solid state image sensing device including a transparent support, at least one transparent substrate chip fixed on the support by a fixing agent, at least one photoelectric converting element on the transparent substrate chip and mold material for covering at least the exposed surfaces of the transparent substrate chip, in which the refractive index of the mold material is higher than or equal to that of the transparent substrate chip. The transparent substrate chips can be arranged in a line which is equal in optical and electrical continuity to a single-line solid state image sensing device of high precision and reliability.

33 Claims, 7 Drawing Sheets

FIG. 11
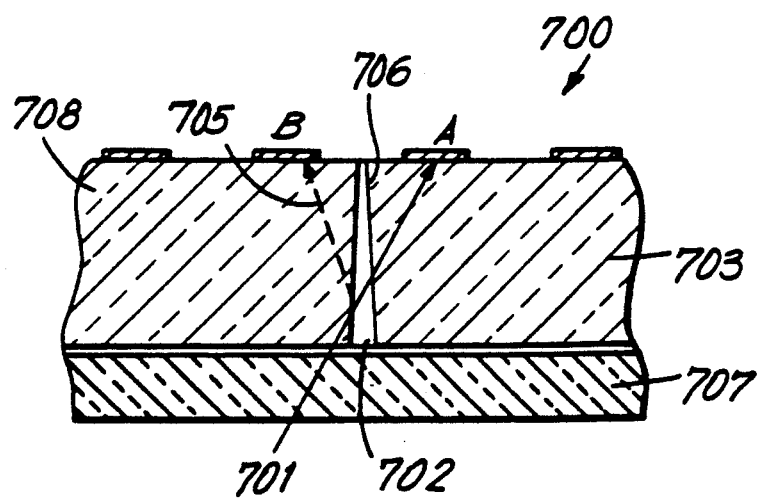
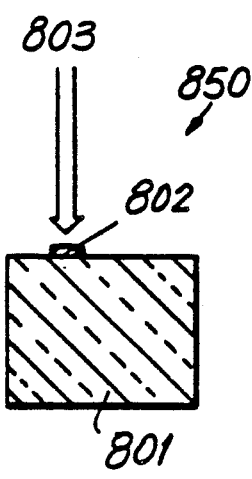
FIG. 12
PRIOR ART
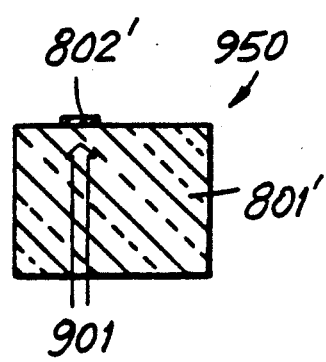
FIG. 13
PRIOR ART

SOLID STATE IMAGE SENSING DEVICE

BACKGROUND OF THE INVENTION

The invention relates generally to an image sensing (image pick-up) device and more particularly to the structure and mounting arrangement of solid state image sensing elements for reading images and the like and the structure or mounting arrangement of solid state image sensing devices having a plurality image sensing elements arranged in a line.

In general, image sensing devices include at least one transparent substrate chip having photoelectric converting elements formed thereon, cut from a transparent substrate having photoelectric converting elements formed thereon. However, conventional image sensing devices suffer from undesireably poor accuracy and reliability caused by problems associated with the mounting structure of the image sensing elements of these devices which cannot satisfactorily provide an elongated solid state image sensing device.

A first type of conventional image sensing device is described in Japanese Laid-open Patent Application No. 86363/84 which includes a large number of charge-coupled device (CCD) chips formed in a staggered arrangement on a single crystal silicon integrated-circuit (IC). The IC is electrically coupled to an external electrical circuit which performs complicated operations including delaying a signal in a manner so that the staggered arrangement has effects of a straight line arrangement.

A second type of conventional image sensing device is described in Japanese Laid-open Patent Application no. 126861/86, which includes a row of IC chips or the like in which the photoelectric converting elements located at the ends of the chip have a different form and structure than the other photoelectric converting elements on the chip.

A third type of conventional solid state image sensing device includes a transparent substrate typically formed of glass such as quartz glass or boro-silicate glass and has photoelectric converting elements formed thereon. Solid state image sensing devices of this type may be classified into the following two categories according to the manner at which light travels to the photoelectric converting elements:

(a) Arranged as shown in FIG. 12, in which a beam of light 803 enters an image sensing device 850 at a photoelectric converting element 802 disposed on the surface of a substrate 801; or (b) An arrangement as shown in FIG. 13 in which a beam of light 901 enters an image sensing device 950 through a transparent substrate 801' and strikes a photoelectric converting element 802' disposed on the surface thereof.

The second arrangement (b) of device 950 is superior in the following respects. Arrangement (b) is not as severely dependent on the optical transparency of the upper exposed surface of photoelectric converting element 802 of device 850. Arrangement (a) requires the surface of element 802 to be sealed by glass having an extremely flat surface, whereas the protective coating or protective mold covering element 802' of device 950 may be selected from a wide variety of known coatings or molds and a highly reliable device can be produced. The structure of the photoelectric converting elements may also be selected from a wide variety of known structures and materials.

For these reasons, second arrangement (b) of device 950 is more frequently employed, and it is common to employ the arrangement of a sensing device 140 shown in FIG. 14. Sensing device 140 includes a transparent support 1001 having a transparent substrate chip 1004 secured thereon by a fixing agent 1002 and photoelectric converting elements formed on chip 1004. A circuit pattern 1010 is disposed on support 1001 and the photoelectric converting elements are electrically coupled to circuit pattern 1010 by a plurality of wires 1003 which can be formed of aluminum, gold, or the like. A mold material 1005 is disposed on and surrounds chip 1004. When device 140 is operating, incident light passes through transparent support 1001 and transparent substrate chip 1004 and strikes the photoelectric converting elements disposed thereon.

Sensing device 140 also includes a seal structure 1006 for preventing protective mold 1005 that covers the exposed surfaces of chip 1004 from flowing. The photoelectric converters and wires 1003 are disposed in protective mold 1005, which is typically formed of an organic polymeric material. Image sensing device 140 also includes a plurality of preamplifier circuits 1007, driver circuits or the like, which are formed on a printed circuit board and are electrically coupled by a connector 1008.

These Conventional mounting arrangements have drawbacks. The first type of arrangement, in which a plurality of chips supporting photoelectric elements are arranged in a line, is advantageous because it is convenient to position the chip connections associated with the in-line arrangement because the chips are disposed in a staggered manner. Further, it is not necessary to modify the structure of the photoelectric converting elements in the chip ends. However, this arrangement has more than two spaced rows of photoelectric converting segments and it is desireable to rearrange them into a single row.

To rearrange the segments into a single row, an additional external device is required to perform complicated electrical operations including delaying a signal. This additional device can be provided within the chips. In addition, because in this arrangement, the imaging segments are spaced in the secondary scanning direction, undesirable restrictions are places on additional necessary optical elements such as lenses. Further, this arrangement provides little degree of freedom in starting and stopping reading and thus its application to facsimile machines, for example, is limited. Thus, this arrangement is generally costly complicated and impractical to utilize.

The pitch between the photoelectric converting elements in the second type of conventional arrangement, in which a plurality of IC chips are disposed in a line, is made constant by forming or structuring the photoelectric converting elements differently at the ends of the chip than elsewhere on the chip. Accordingly, there is no continuity at the chip connection ends. To ensure the desired continuity, undesirable special electrical processes are required.

The third type of conventional arrangement has the following problems:

(1) Because light is introduced into the device through a transparent substrate having photoelectric converting elements formed thereon, the path of light passing through the device is complicated. It has been determined that irregular refraction and reflection is likely to occur and stray light can be reflected or refracted to the photoelectric converting elements and can degrade the resolution or gradient and limit reading speed.

To avoid this drawback, conventional devices such as a sensing device 150 having the cross-section shown in FIG. 15 can be provided in which $s > t * \tan \Theta$, wherein $\Theta$ is the maximum angle of incidence of light. Device 150 includes a transparent substrate 1101 having a transparent substrate chip 1102 of thickness "t" disposed thereon and a photoelectric converting element 1103 on chip 1102. Stray light such as an incident ray of light 1105 or 1106 from a side 1104 of chip 1102 cannot enter photoelectric converting element 1103. If "t" is 1 mm and $\Theta = 15$, for example, than "s" is larger than 0.26 mm and an undesireably large useless region is present.

(2) Because transparent substrate chip 1102 is fixed on transparent support 1101, light must pass through transparent support 1101 and chip 1102 before striking element 1103. Therefore, support 1101 and the material fixing chip 1102 to support 1101 must be transparent, and these are various requirements imposed on their optical characteristics such as the refractive index. In addition, particularly in an in-line arrangement of transparent substrate chips, photoelectric converting elements are located close to the connections between chips. Thus, many requirements exist concerning the optical characteristics at the connection.

(3) The transparent substrate chips supporting the photoelectric converting elements and the transparent support are commonly formed of different materials. For example, the transparent substrate chips are commonly formed of highly heatresistant quartz. However, because the support has a wide surface area, it is commonly formed of an inexpensive glass, such as soda glass or boro-silicate glass. Thus, the coefficient of thermal expansion of the two materials commonly differ by about two orders of magnitude. Accordingly, separation or breakage is likely to occur therebetween, leading to low reliability.

FIG. 16 shows a device 1600 having a conventional arrangement of two substrate chips 1602 and 1603 fixed to a transparent substrate 1601 by a fixing agent 1605. The coefficient of thermal expansion of chips 1602 and 1603 secured greatly from that of substrate 1601. Accordingly, because the chips and substrate expand and contract by different amounts when device 1600 is heated and cooled, a plurality of gaps 1604 can form in fixing agent 1605, different portions of device 1600 will have different optical properties and the security of the bond of chips 1602 and 1603 to device 1600 is diminished. In view of these drawbacks, especially when considered together with the disadvantages noted in problem (2) it has been impractical to form image sensors with this arrangement.

(4) It is impractically difficult to properly mount the sensor device elements on the transparent support and driver circuits, preamplifier circuits and the like must be prepared separately.

(5) It is inconvenient to provide suitable structures for preventing the flow of the protective mold and additional manufacturing steps are required to add these structures.

Accordingly, it is desireable to provide an image sensing device which overcomes the disadvantages of the prior art.

SUMMARY OF THE INVENTION

Generally speaking in accordance with the invention, a solid state image sensing device including a transparent support, at least one transparent substrate chip secured on one surface of the support by a transparent fixing agent, at least one, photoelectric converting elements formed on each transparent substrate chip opposite the side fixed to the support and mold material for covering the exposed sides of the transparent substrate chips is provided. The refractive index of the mold material is equal to or larger than that of the transparent substrate chips. The transparent substrate chips can be formed of quartz glass and the anti-reflection mold can be formed of a silicone resin having a refractive index higher than or equal to 1.465.

In another embodiment the image sensing device includes two or more transparent substrate chips mounted on the support and arranged so that the plurality of photoelectric converting elements formed on the transparent substrate chips are in a straight line and a filler material is disposed in the gaps between opposite faces of transparent substrate chips. Both the anti-reflection mold and the filler have a refractive index greater than or equal to that of the transparent substrate chips. The filler and the anti-reflection mold can be formed of the same material and the filler and the fixing agent can be formed of the same material.

The solid state image sensing device may include a support formed of a transparent film and at least one transparent substrate chip fixed to the transparent film by a fixing agent. The device also includes an insulating material substrate fixed to the support film and having apertures formed therethrough, the apertures sized and positioned to surround the transparent substrate chips. A mold material covers at least the exposed sides of the transparent substrate chips. The refractive index of the mold material is higher than or equal to that of the transparent substrate chips. A conducting pattern can be formed on the face of the insulating material substrate that is not in contact with the agent fixing the substrate to the support film.

The fixing agent can have a refractive index equal to or higher than that of the transparent substrate chips and can have a modulus of elasticity which decreases with increasing temperature. The mold material can be formed of one or more organic polymer materials and can have a shore hardness whose value is less than or equal to 20 after being hardened. The organic polymer materials can be reactive polymers or silicone materials.

Accordingly, it is an object of the invention to provide an improved image sensing device.

It is another object of the invention to provide a widearea type elongated solid state image sensing device.

A further object of the invention is to provide a solid state in-line type image sensing device in which element chips are arranged in a line and are equal in optical and electrical continuity to a single-line solid state image pickup device.

Yet another object of the invention is to provide a high precision, highly reliable, easy to use, low cost and compact image sensing device.

Still another object of the invention is to provide improved anti-reflection and reflective mold material for an image sensing device.

Still a further object of the invention is to provide improved fixing materials for an image sensing device.

Still other objects and advantages of the invention will in part be obvious and will in part be apparent from the specification and drawings.

The invention accordingly comprises the features of construction, combinations of elements, and arrangements of parts which will be exemplified in the constructions hereinafter set forth, and the scope of the invention will be indicated in the claims.

BRIEF DESCRIPTION OF THE DRAWINGS

For a fuller understanding of the invention, references is had to the following description taken in connection with the accompanying drawings, in which:

FIG. 11 is a partial cross-sectional view of an image sensing device formed in accordance with the invention showing two transparent substrate chips arranged in a straight line;

FIGS. 12 and 13 are schematic diagrams showing two different pathways of light through image sensing elements;

DETAILED DESCRIPTION OF PREFERRED EMBODIMENTS

Figure 1:
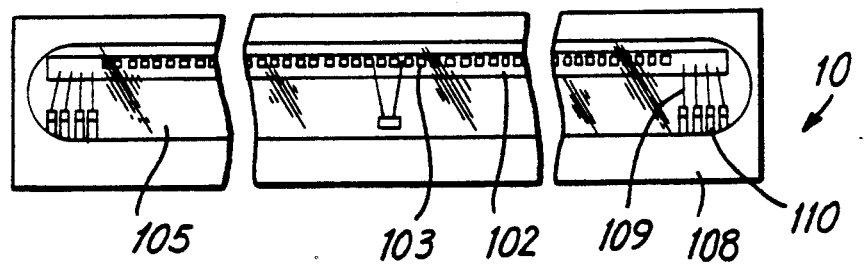
FIG. 1 is a schematic partial plan view of a solid state image sensing device constructed and arranged in accordance with the invention.
Figure 2:
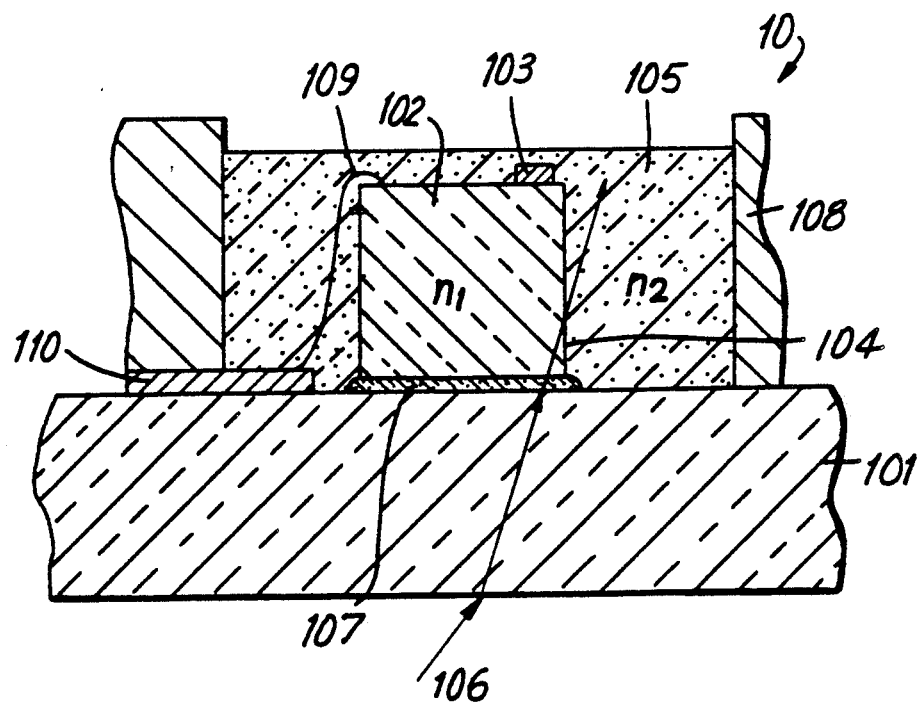
FIG. 2 is a cross-sectional view of the image sensing device of FIG. 1.

FIGS. 1 and 2 are a schematic plan view and a transverse sectional view, respectively, of a solid state image sensing device 10 formed in accordance with a first embodiment of the invention. Sensing device 10 includes a transparent support 101 which can be formed of barium boro-silicate glass. A transparent substrate chip 102, is fixed to one face of support 101 with a fixing agent 107 which can be an ultraviolet-cured acrylic adhesive. Chip 102 can be formed of quartz glass having a refractive index of 1.46. A photoelectric converting element 103 is disposed on a top surface of chip 102. Exposed surfaces of transparent substrate chip 102 and element 103 are covered with an anti-reflection mold 105. Anti-reflection mold 105 can include addition-polymerized silicone resins such as those having a refractive index of 1.49.

Chips 102 are disposed on substrate 101 with an elongated opening formed in a frame 108. Light is converted to an electrical signal carried by a wire 109 to peripheral circuit 110 formed at the end of the opening in frame 108.

While preferred, it is not necessary to include the antireflection mold. However, without the anti-reflection mold light rays 106 incident to a side surface 104 of transparent substrate chip 102 will scatter at the interface. Some light will be reflected and will not pass through as does light ray 106. This can lead to stray light within the device which can degrade the characteristics of the elements. Because incident light rays are guided to the photoelectric converting elements 103 through transparent support 101 and transparent substrate chip 102, it is desirable to cover at least the sides of transparent substrate chip 102 with anti-reflection mold material 105.

The principal characteristic of the anti-reflection mold material which determines its ability to prevent undesired light from scattering to the photo-converting elements is the refractive index of the mold material. Specifically, assuming that the refractive index of transparent substrate 101 is $n_1$ and the refractive index of anti-reflection mold 105 is $n_2$, the following relation should exist:

$$n_1 \leq n_2$$

The materials for substrate 101 and mold 105 should be selected so that this relationship is satisfied within the wavelength and temperature range encountered within the device during use. Most preferably, $n_1$ and $n_2$ should have as similar values as possible. The material of mold 105 may be colored and may contain inorganic fillers, as long as the above noted relation is maintained. To improve the operating reliability of device 10, the material of mold 105 should be able to protect photoelectric converting elements.

Problem (1), light passing through several materials, noted above, may be solved easily even if the incident light passes through a complex transparent structure. If the cross-section of transparent substrate 101 has a refractive index of a required minimum value, stray light encountering element 103 caused by irregular refraction of light will be negligible and it is thus possible to avoid a significant decrease in the resolution or gradient of photoelectric converting elements 103. This makes it possible to provide photoelectric converting elements having improved reading speed.

Figure 6:
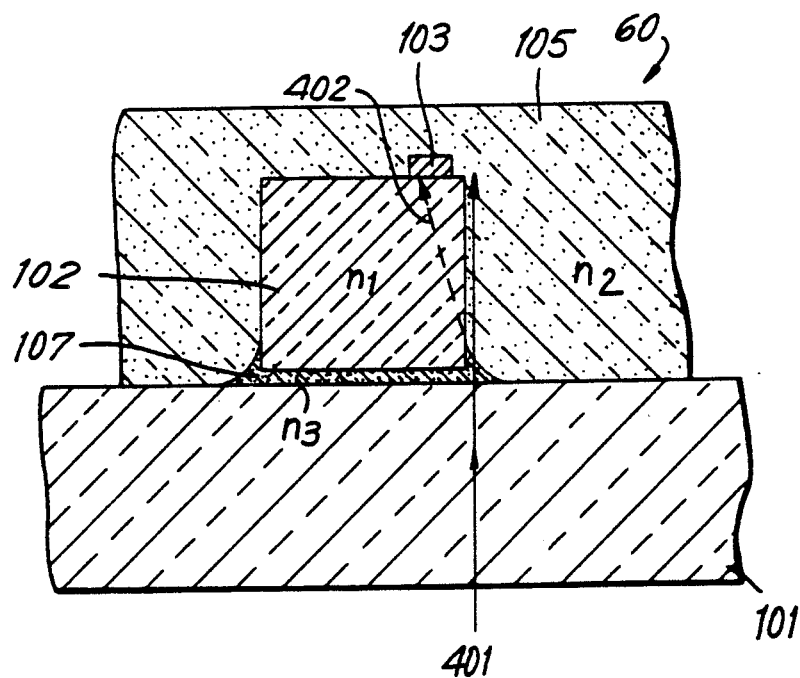
FIG. 6 is a schematic cross-sectional view of an image sensing device formed in accordance with the invention illustrating the effects of the relation between refractive indices of a transparent substrate chip and a fixing agent on stray light.

A device 60 formed with many of the same elements as image sensing device 10 is shown in cross-section in FIG. 6 with similar elements assigned the same reference numerals. The indices of refraction of substrate chip 102, mold material 105 and fixing agent 107 are referred to as $n_1$, $n_2$ and $n_3$ respectively. It is preferred that $n_1$ is less than or equal to $n_2$ and $n_3$. It is more preferred that $n_2$ and $n_3$ or $n_1$, $n_2$ and $n_3$ have as similar refractive indices as possible. It this condition is met, a light beam 401 will travel straight through device 60 and will not give a false reading. If the value of $n_1$, $n_2$ and $n_3$ were improper, light 401 could be unintentionally deflected in the direction of broken line 402 and generate a false reading on element 103.

Figure 3:
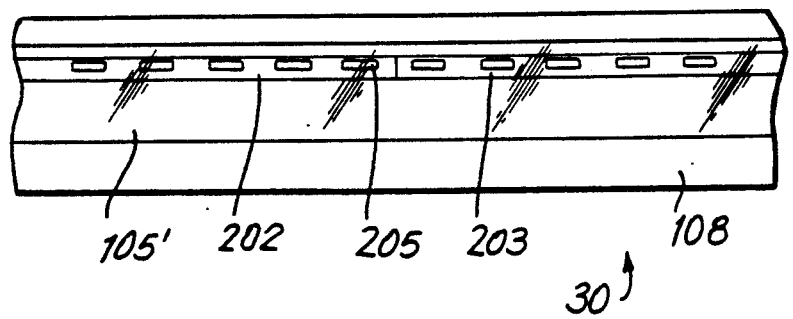
FIG. 3 is a schematic plan view of an image sensing device formed in accordance with the invention in which two transparent substrate chips are arranged in a straight line.
Figure 4:
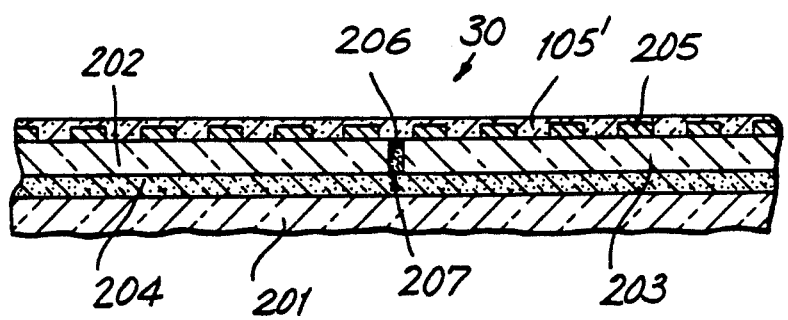
FIG. 4 is a cross-sectional view of the image sensing device of FIG. 3.

The arrangement of device 10 above can be employed in a solid state image sensing device 30 formed in accordance with a second embodiment of the invention shown in FIGS. 3 and 4. This embodiment includes two transparent substrate chips 202 and 203 mounted on a transparent support 201 in a substantially straight line by a fixing agent 204. Chips 202 and 203 have a plurality of photoelectric converting elements 205 formed thereon, arranged in a straight line.

Transparent support 201 can be formed of low alkali glass. Transparent substrate chips 202 and 203 can be formed of quartz glass. Fixing agent 204 can be a known ultraviolet-hardened urethane-modified acrylic fixing agent. Photoelectric converting elements 205 can be formed on transparent substrate chips 202 and 203. An anti-reflective mold 105' is included to cover transparent substrate chips 202 and 203 and can be formed of an addition polymerized silicone resin having a refractive index of 1.52.

Device 30 also includes a filler 206 placed between the adjacent opposing faces of transparent substrate chips 202 and 203. Filler 206 is preferably an ultraviolet-hardened acrylic resin having a refractive index of 1.47 for example and is preferably prehardened before being fixed to transparent support 201. Filler 206 should be selected from materials having appropriate adhesive strength and refractive index.

Figure 16:
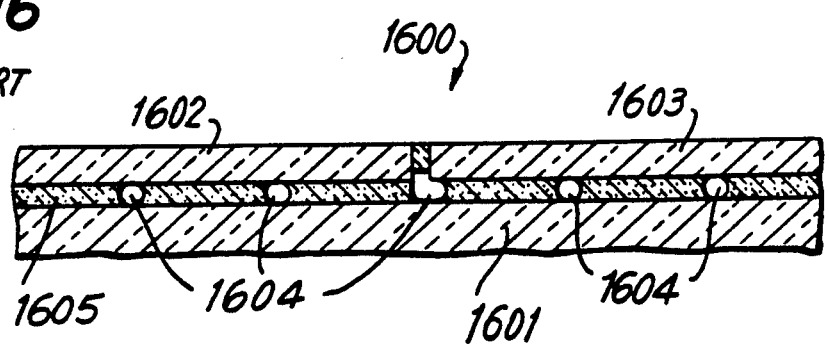
FIG. 16 is a cross-sectional view showing gaps in the fixing agent in a prior art solid state image sensing device.
Figure 17:
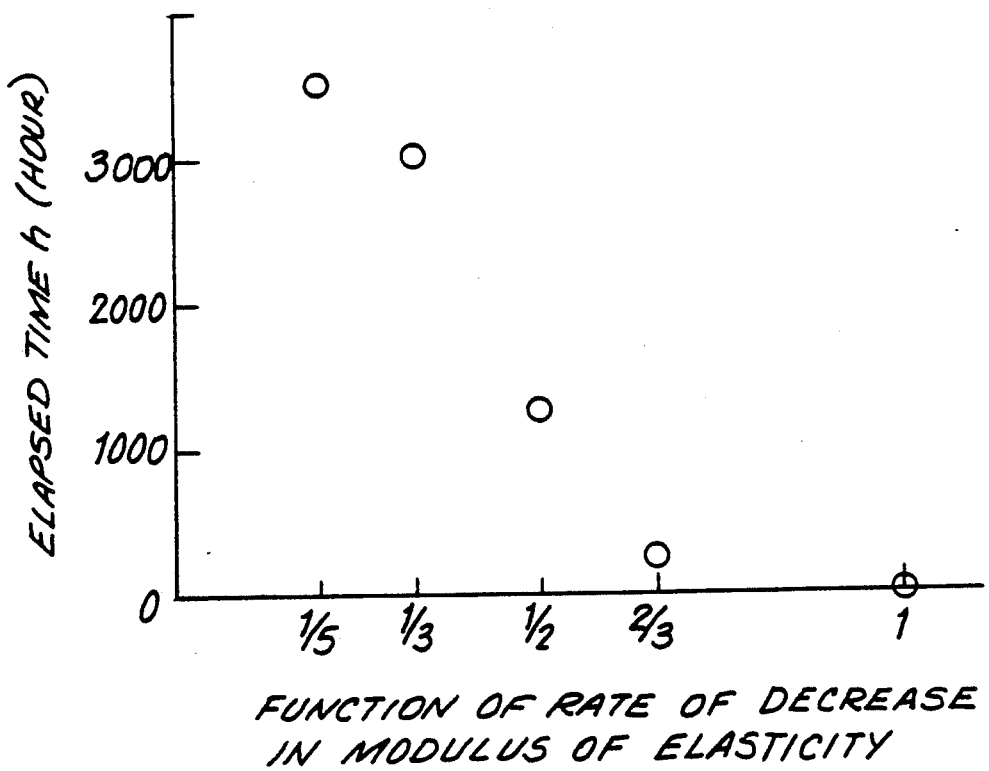
FIG. 17 is a graph showing the variation of reliability of an image sensing device formed in accordance with the invention and the rate of decrease in modulus of elasticity.

As discussed at paragraphs (2) and (3), the two transparent substrate chips and the transparent support are frequently formed of different materials and have different coefficients of linear expansion. At high temperatures the transparent support may expand and pull on the transparent substrate chips. This causes a large tensile stress at an interface 207 between transparent chips 202 and 203. If the adhesive strength at the interface is low, separation can occur at high temperatures as was discussed above with reference to FIG. 16. Such separation will cause light passing through the interface to scatter which interferes with the desired optical uniformity. For example, some of the elements can perceive a "white" portion as "black". Therefore, the filler should have sufficiently high adhesive strength or flexibility to withstand the stress caused by thermal expansion.

The optical properties of an image forming device 700 including at least a pair of transparent substrate chips 703 and 708 are illustrated in FIG. 11. An interface 706 is present between transparent substrate chips 703 and 708 and is filled with a filler material 702. Interface 706 can be in the path of incident light and cause errors. Accordingly, filler 702 should have optical properties similar to those of substrate chips 703 and 708 as discussed above. Thus, assuming that transparent substrate chips 703 and 708 have a refractive index of $n_1$ and filler 702 has a refractive index of $n_4$, the following relation: $n_1 \leq n_4$ should also be maintained within the range of wave lengths and temperatures at which the sensing elements will encounter during operation of device 700. Further, because interface 706 should not form an optically discontinuous surface between transparent substrate chips 703 and 708, $n_1$ and $n_4$ should have as similar values as is practical and filler 702 should also have a transmission factor that is close to that of the material of transparent substrate chips 703 and 708. Filler 702 can be formed from the same material as forms the antireflection mold.

Accordingly, a solid state image sensing device having two or more transparent substrate chips arranged substantially in a straight line can have the same advantageous characteristics as a device having a single chip.

Figure 5:
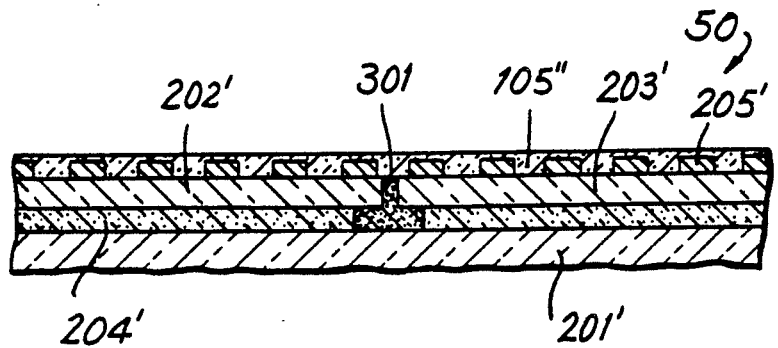
FIG. 5 is another cross-sectional view of an image sensing device formed in accordance with the invention, in which two transparent substrate chips are arranged in a straight line.

Referring to FIG. 5, a portion of an image sensing device 50 constructed in accordance with a third embodiment of the invention is shown. Device 50 includes transparent substrate chips 202' and 203' fixed to a transparent support 201' by a fixing agent 204'. Chips 202' and 203' have photoelectric converting elements 205' formed thereon. Transparent support 201' can be formed of Neoceram available from Nihon Denki Glass Corp. Chips 202' and 203' are preferably formed of quartz glass. A sticky ultraviolet-hardened acrylic resin, such as urethane-modified acrylic is a preferable material for fixing agent 204'.

A filler 301 is disposed in the space between adjacent faces of chips 202' and 203'. Filler 301 is preferably a U-V cured acrylic resin. If chips 202' and 203' are formed of quart glass, filler 301 can have a refractive index of 1.48 which should be higher than or equal to that of chips 202' and 203'. Fixing agent 301 can also have a modulus of elasticity which decreases with increasing temperature, for example 2 kg/cm$^2$ at room temperatures which decreases by one half at 80° C.

The properties of fixing agent 204' are important for providing an acceptable sensing device. In the embodiment shown in FIGS. 3 and 4, problem (3), different coefficients of thermal expansion leading to separation of the chips from the support, is solved by selecting filler material 206 to have an adhesive strength great enough to withstand the tensile stress which occurs at the interface. In the embodiment shown in FIG. 5, the tensile stress at the interface is made as small as possible by selecting a fixing agent material which has a modulus of elasticity which decreases as the temperature increases. The fixing agent preferably contains a sticky component, such as silicon, which does not contribute to the adhesive function of the agent and adhesive components of the agent should harden as little as possible when heated. As the elements of the sensing device expand disproportionately, separation of fixing agent does not occur in view of the increased flexibility of the fixing agent.

Figure 8:
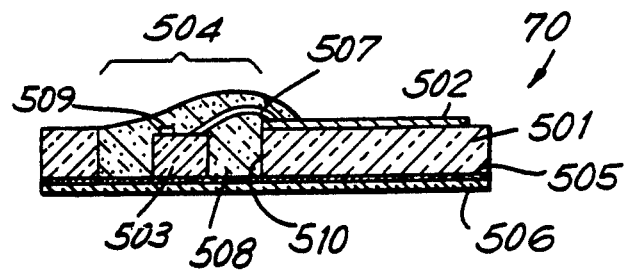
FIG. 8 is a partial cross-sectional view of the image sensing device of FIG. 7.
Figure 7:
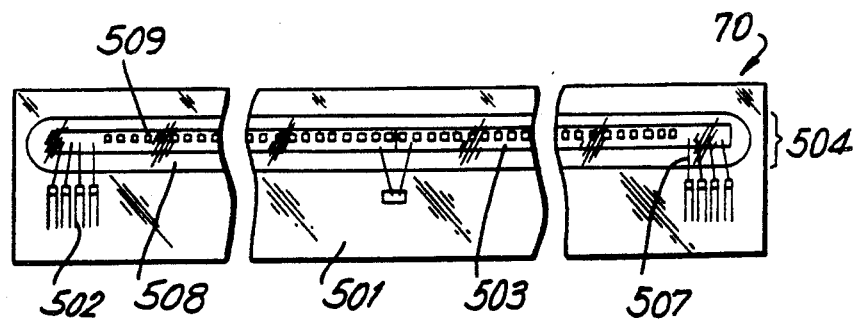
FIG. 7 is a top plan view of a solid state image sensing device formed in accordance with the invention.

FIGS. 7 and 8 are a schematic plan view and a cross-sectional view of a solid state image sensing device 70 formed in accordance with a fourth embodiment of the invention. Device 70 includes a substrate of insulating material 501 fixed to a support film 506 by a fixing agent 505 which can be a silicone adhesive. Support film 506 can be plastic film such as polyester (polyethylene terephthalate). Substrate 501 can be formed of about a 1.6 mm thick glass-epoxy laminated plate. A conducting pattern 502 and driver circuits and preamplifier circuits are provided on substrate 501.

Substrate of insulative material 501 includes an elongated opening 504 defined by inner walls 510 sized to surround a transparent substrate chip 503 which is fixed to support film 506 by fixing agent 505. Chip 503 is preferably formed of quartz glass having a refractive index of 1.46. A photoelectric converting element 509 is formed on chip 503 and an anti-reflective mold 508 is disposed on the exposed surfaces of chips 503 and element 509 in opening 504 to protect the elements of device 70.

Two transparent substrate chips 503 and insulating material substrate 501 can be aligned together and fixed on the sticky surface of support 506. Transparent substrate chips 503 and conducting pattern 502 on insulating material substrate 501 are electrically coupled by aluminum wires 507, which can be 35 microns in diameter. Anti-reflective mold 508 can preferably be formed of an addition-polymerized silicone resin having a refractive index of 1.47.

This fourth embodiment solves problem (4), difficulty in mounting elements on the transparent support, by providing an opening in a substrate to surround the transparent substrate chips which are mounted on a substrate different than the driver circuits and preamplifier circuits. The fourth embodiment also solves problem (5), preventing the flow of the protective mold without adding manufacturing steps and additional structures. Because the fourth embodiment can include the same materials and satisfy the same criteria as the first, second and third embodiments, the fourth embodiment includes means for solving problems (1), (2) and (3) as well.

Insulating material substrate 501 may be formed of either organic or inorganic material. It preferably includes a BT resin-glass laminated plate such as, for example, one available from Mitsubishi Gas Chemical Corp.. Although organic materials have superior workability and boring properties, for example, inorganic materials have superior resistance to heat which is beneficial for heating processes such as soldering. Highly heat-resistant materials such as, glass-epoxy laminated plates and a super-engineering plastics, for example are preferred overall. A more compact arrangement can be achieved by mounting IC's, resistors, capacitor and other circuit components on the substrate surface.

Support 506 may be formed of a polyimide tape provided with an adhesive, such as is available from Sumitomo Three M Corp., for example or a polyethersulphone (PES) film provided with an epoxy resin adhesive or the ultraviolet-hardened acrylic adhesive, such as is used as the fixing agent at the connection, coated thereon. The PES film should preferably be used together with a fixing agent. A glass plate having an adhesive coated thereon as fixing agent 505 may also be employed as support 506.

Anti-reflection mold 508 may be formed of a thermosetting acrylic resin having a refractive index of 1.51, an ultraviolet-hardened urethane-modified acrylic resin having a refractive index of 1.48, or a moisture-hardened silicone resin. As noted above, the refractive index of mold 508 should be higher than or equal to that of chip 503.

In accordance with this embodiment of the invention, a 2 mm thick BT resin-glass laminated plate was used as insulating material substrate 501. Conductor pattern 502 was formed thereon and opening 504 was bored therethrough to surround transparent quartz glass substrate chips 503 having photoelectric converting elements 509 formed thereon. An ultraviolet-hardened acrylic adhesive was applied as fixing agent 505 to a polyethersulphon (PES) film support 506 and insulating material substrate 501 and transparent substrate chips 503 were positioned relative to one another on support film 506 and fixed thereto with fixing agent 505. The conducting pattern on transparent substrate chips 503 was electrically coupled to the pattern on the insulating material substrate by aluminum wires 507, and a silicone gel having a shore hardness of zero was placed in opening 504 and over wires 507 as an anti-reflection mold.

Two 100 mm quartz glass chips 503 were connected. Chips 503 had a coefficient of thermal expansion that was more than two orders of magnitude different from that of the BT resin-glass laminated insulating substrate 501. In this arrangement, when the device was operated at high temperatures of about 60° C. for example, or when the device is left at high temperatures of about 80° C. for example, chips 503 and substrate 501 will exert very large forces on one another. The aluminum wires connecting them will undergo very large bending forces and, in the worst case, they can be broken. The properties of the organic polymer material employed as anti-reflection mold 508 can be useful in solving this problem. The hardness after this material is cured can be particularly important. Specifically, the hardness after curing should be less than or equal to shore A 20.

Figure 9:
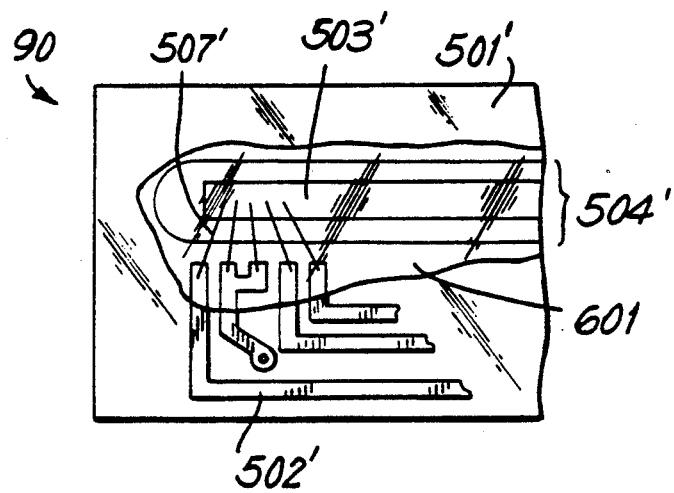
FIG. 9 is a partial plan view of a solid state image sensing device formed in accordance with the invention showing connecting wires and surrounding structures.
Figure 10:
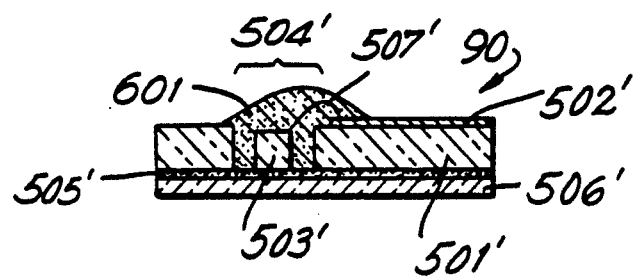
FIG. 10 is a cross-sectional view of the portion of the image sensing device of FIG. 9.
Figure 14:
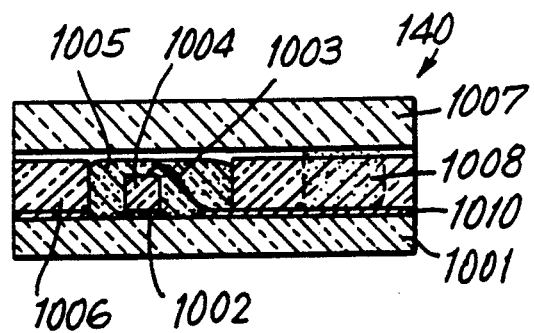
FIG. 14 is a cross-sectional view of a solid state image sensing device arranged in accordance with the prior art.
Figure 15:
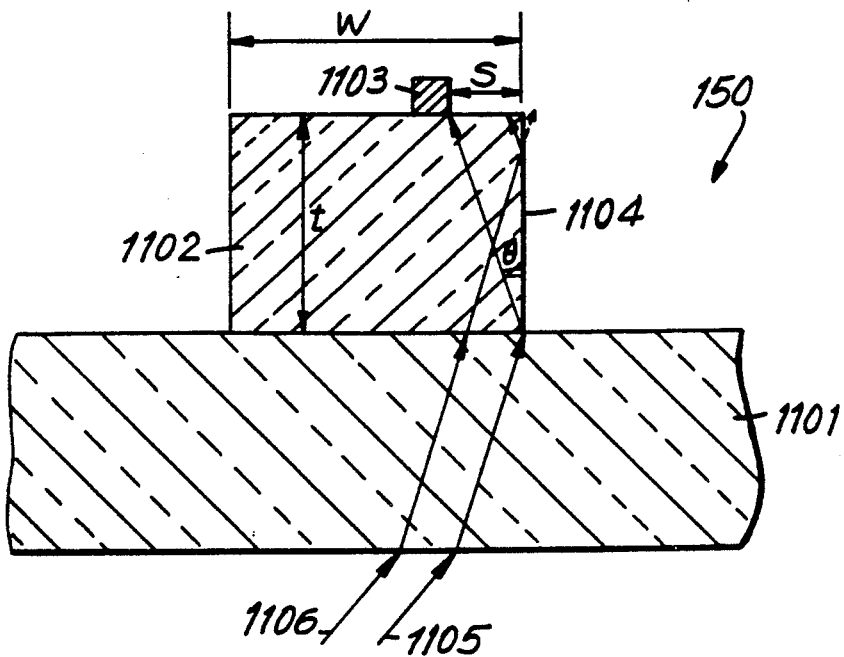
FIG. 15 is a schematic diagram illustrating a technique for preventing stray light from reflecting from sides of a transparent substrate chip onto a photoelectric converting element.

An image sensing device 90 prepared in accordance with a fifth embodiment of the invention is shown in FIGS. 9 and 10. Device 90 includes a support 506' covered with a fixing agent 505' and an insulating material substrate 501' thereon. Insulating material substrate 501' includes at least one opening 504' formed therein and defined by an inner wall 510'. A transparent substrate chip 503' supporting a photoelectric converting element is disposed on fixing agent 505' within opening 504'. A conducting pattern 502' is disposed on insulating material substrate 501' and is electrically coupled to photoelectric converting elements on chips 503' by a wire 507'. Transparent substrate chip 503' is covered on the sides and connected faces by a silicone gel 601 having a hardness of shore A zero after hardening.

The filler material can have satisfactory reliability and performance even if it is formed of a single material (silicone) instead of the materials described with reference to the second embodiment that have high adhesive strength. In addition to a support 506' formed of BT resin glass, this arrangement is also appropriate with a support 506' formed of a polyethersulphon (PES) film coated with an epoxy resin adhesive, or a single-liquid condensed silicone of a shore hardness A 20. In general, materials can be substituted among the different embodiments described herein where appropriate.

Figure 18:
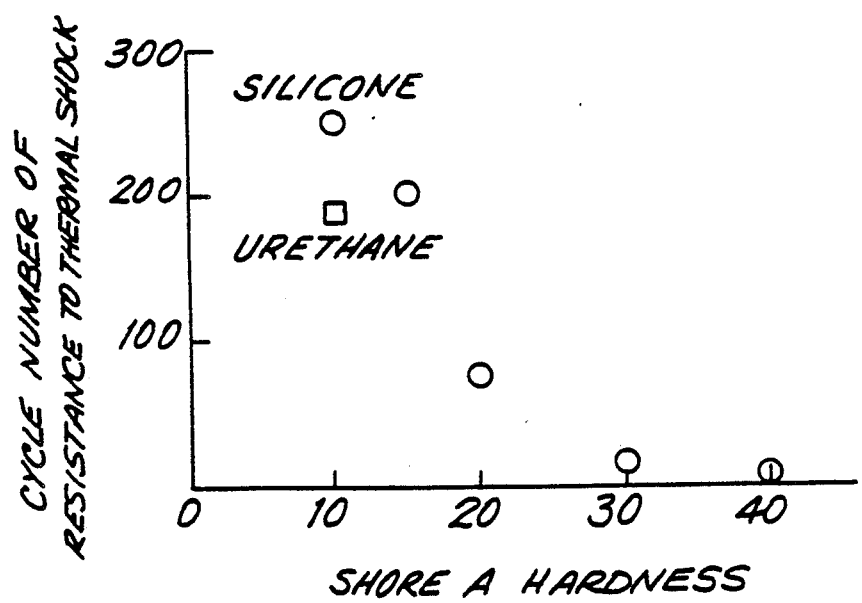
FIG. 18 is a graph showing the reliability of organic polymer materials as a function of hardness.

The fifth embodiment achieves improved reliability, particularly in resistance to thermal shock. FIG. 18 shows the relation between the resistance to thermal shock as expressed by the life cycle number at temperatures from −30° C. to 70° C. and the shore A hardness "n" for different materials such as a silicone resin and an urethane resin.

Generally, the different materials of the sensing device should not have coefficients of thermal expansion that differ by a greater degree than the materials noted above. If the difference is larger, the hardness of the adhesive should be decreased further to prevent separation. If the overall length is longer than noted above (250 mm), the length of thermal expansion will increase and the hardness should be decreased. However, the variations were found to be insignificant when the length was increased up to about 350 mm.

The optical properties of the filler at the connection region can be of primary importance. In that case, an ultraviolet-cured acrylic resin having the necessary optical properties can be employed at the connection region and not elsewhere.

Substantially the same materials as those used in the fifth embodiment can be used in a sixth embodiment except that a silicone gel that hardens at 80° C. was used as the material for the anti-reflection mold. In this sixth embodiment, the hardening temperature of the organic polymer material of the anti-reflection mold is restricted to a particular value, leading to improved reliability in an in-line arrangement of transparent substrate chips. Specifically, it has been found that the device can maintain excellent image sensing properties in a high-temperature shelf test at 60°-80° C. for more than 1,500 hours. The reliability is estimated at the maximum quality assurance condition of 80° C. required for office automation devices including solid state image sensing devices. The sixth embodiment is particularly well suited to an arrangement in which resin is charged into the interface between the connected ends of transparent substrate chips as well as to other arrangements.

To cure the mold formed of a reactive polymer material, for example, the atmosphere surrounding the mold is heated to greater than or equal to about 40° C. during ultraviolet irradiation. It is preferable to use temperatures of about 50° to 85° C.

In the case of ultraviolet-hardened urethane-modified acrylic resins which can also be hardened by heating, it has been found that ultraviolet irradiation in an atmosphere of temperatures greater than or equal to 40° C. (preferably 50°-80° C.) followed by heating at a required temperature for a required length of time will provide satisfactory hardening. Moisture-hardened condensed silicone is preferably hardened in an atmosphere at temperatures greater than or equal to 40° C., such as at 55° C. and 90% relative humidity.

Thermally hardened materials, such as thermosetting addition-polymerized silicone resins or thermosetting acrylic resins require temperatures equal to or higher than 90° C. for hardening. However, they may be hardened either by (1) causing hardening to progress at temperatures of from 50° to 85° C. at which hardening begins to take place for an extended period or by (2) heating to a temperature above 90° C. after a temporary hardening in an atmosphere of between 50°-85° C. Such hardening process will provide satisfactory results for an 80° C.-hardening reactive resin.

The image sensing devices constructed in accordance with the fifth and sixth embodiments of the invention can be subjected to high tensile stress at the connection between the transparent substrate chips at temperatures of about 60° to 80° C. To permit the connection to withstand the stresses: (1) the hardening atmosphere is maintained at high temperatures so that stresses at the connection between the transparent substrate chips will be compressive stresses at ordinary temperatures and (2) employing an organic polymer material as the reactive polymer material. These measures help provide stable connections between the transparent substrate chips.

The foregoing is also applicable to the second embodiment of the image sensing device. A hardening process at temperatures equal to or higher than 40° C., particularly from 50° to 85° C. may be carried out as described above to harden the organic polymer or the fixing agent, particularly those designated by reference numerals 204 and 205 in FIG. 2. The organic polymer is then reactive and possess an additional function of fixing the connection between the transparent substrate chips.

It will thus be seen that the objects set forth above, among those made apparent from the preceding description, are efficiently attained and, since certain changes may be made in carrying out the above method and in the constructions set forth without departing from the spirit and scope of the invention, it is intended that all matter contained in the above description and shown in the accompanying drawings shall be interpreted as illustrative and not in a limiting sense.

*It is also to be understood that the following claims are intended to cover all of the generic and specific features of the invention herein described and all statements of the scope of the invention which, as a matter of language, might be said to fall therebetween.

Particularly it is to be understood that in said claims, ingredients or compounds recited in the singular are intended to include compatible mixtures of such ingredients wherever the sense permits.

What is claimed is:

1. A solid state image sensing device, comprising:
a transparent substrate for allowing incident light to pass therethrough;
at least one transparent substrate chip mounted on the substrate and having exposed surfaces for receiving light passing through at least the substrate;
at least one photoelectric converting element disposed on the transparent substrate chip for receiving light passing through at least the substrate and substrate chip; and
anti-reflection mold material disposed on a portion of the transparent substrate and on at least the exposed surfaces of the transparent substrate chip, the refractive index of the anti-reflection mold material being equal to or higher than the refractive index of the transparent substrate chip.

2. The image sensing device of claim 1, wherein the transparent substrate chip is formed of quartz glass and the antireflection mold material is a silicone resin having a refractive index equal to or higher than 1.46.

3. The image sensing device of claim 1, wherein the transparent substrate chip is formed of low alkali glass and the mold material is formed of an addition polymerized resin having a refractive index of at least 1.52.

4. The image sensing device of claim wherein the transparent substrate chip is secured to the substrate by a fixing agent having a refractive index equal to or higher than that of the transparent substrate chip.

5. The image sensing device of claim 4, wherein the fixing agent has a modulus of elasticity which decreases with increasing temperature.

6. The image sensing device of claim 1, wherein the mold material includes at least one organic polymeric material.

7. The image sensing device of claim 6, wherein the organic polymer has a shore A hardness value equal to or lower than 20, after the polymer is hardened.

8. The image sensing device of claim 6, wherein the organic polymer is a reactive polymer.

9. The image sensing device of claim 6, wherein the organic polymer is a silicone material.

10. A solid state image sensing device, comprising:
a transparent substrate;

at least two transparent substrate chips having faces mounted on the substrate and having exposed surfaces, so that two faces of adjacent chips oppose each other and a plurality of photoelectric converting elements are disposed on the transparent substrate chips and arranged in a straight line;

anti-reflection mold material disposed on a portion of the transparent substrate and at least the exposed surfaces of the transparent exposed substrate chips; and filler material disposed between the opposing faces of the transparent substrate chips, the anti-reflection mold material and the filler material having a refractive index equal to or higher than that of the transparent substrate chips.

11. The image sensing device of claim 10, wherein the filler material and the anti-reflection mold material are the same material.

12. The image sensing device of claim 10, wherein the filler material and the fixing agent are the same material.

13. The image sensing device of claim 10, wherein the transparent substrate chip is formed of quartz glass and the antireflection mold material is a silicone resin having a refractive index equal to or higher than 1.46.

14. The image sensing device of claim 10, wherein the transparent substrate chip is formed of low alkali glass and the mold material is formed of an addition polymerized resin having a refractive index of at least 1.52 and the filler material includes an ultraviolet-hardened acrylic resin having a refractive index of at least 1.47.

15. The image sensing device of claim 10, wherein the mold material includes at least one organic polymeric material.

16. The image sensing device of claim 10, wherein the fixing agent has a modulus of elasticity which decreases with increasing temperature.

17. The image sensing device of claim 10, wherein the fixing agent has a refractive index equal to or higher than that of the transparent substrate chip.

18. The image sensing device of claim 15, wherein the organic polymer is a reactive polymer.

19. The image sensing device of claim 15, wherein the organic polymer is a silicone material.

20. The image sensing device of claim 15, wherein the organic polymer has a shore A hardness whose value is equal to or lower than 20, after the polymer is hardened.

21. The image sensing device of claim 10, wherein the substrate chips each support a plurality of photoelectric converting elements including photoelectric converting elements at the ends thereof, with the end photoelectric converting elements having the same shape and structure as those located elsewhere.

22. A solid state image sensing device, comprising:

a transparent substrate film for allowing incident light to pass therethrough;

a fixing agent disposed on said substrate;

at least one transparent substrate chip mounted on the substrate film by the fixing agent and having exposed surfaces for receiving light passing through at least the substrate film and the fixing agent;

at least one photoelectric converting element formed on the transparent substrate chip for receiving light passing through at least the substrate film, the fixing agent and the substrate chip;

an insulating material substrate having inner walls defining an elongated inner opening, the inner walls dimensioned so that the opening is larger than the at least one transparent substrate chip and positioned to surround the substrate chip, the insulating material mounted on the substrate film by the fixing agent; and an anti-reflective mold material disposed on at least the exposed surfaces of the transparent substrate chip, the mold material having a refractive index equal to or higher than that of the transparent substrate chip.

23. The image sensing device of claim 22, wherein a conducting pattern is formed on a surface of the insulating material substrate which is not in contact with the fixing agent and the photoelectric converting elements formed on the transparent substrate chips are electrically coupled to the conducting pattern.

24. The image sensing device of claim 22, wherein the fixing agent has a refractive index equal to or higher than that of the transparent substrate chip.

25. The image sensing device of claim 22, wherein the fixing agent has a modulus of elasticity which decreases with increasing temperature.

26. The image sensing device of claim 22, wherein the mold material includes at least one organic polymeric material.

27. The image sensing device of claim 26, wherein the organic polymer has a shore A hardness whose value is equal to or lower than 20, after the polymer is hardened.

28. The image sensing device of claim 26, wherein the organic polymer is a reactive polymer.

29. The image sensing device of claim 26, wherein the organic polymer is a silicone material.

30. The image sensing device of claim 22, wherein the substrate film is a plastic film.

31. The image sensing device of claim 22, wherein the transparent substrate is a film of one of polyethylene terephthalate and polyethersulphon.

32. The image sensing device of claim 22, wherein the insulating material substrate is one of a resin - glass laminated plate and a super engineering plastic.

33. The image sensing device of claim 32, wherein the resin is an epoxy resin.

* * * * *